United States Patent [19]

Nitkiewicz

[11] Patent Number: 4,953,061
[45] Date of Patent: Aug. 28, 1990

[54] HOLDER FOR PRINTED CIRCUIT BOARD COMPONENTS

[75] Inventor: Charles Nitkiewicz, Chicago, Ill.

[73] Assignee: Zenith Electronics Corporation, Glenview, Ill.

[21] Appl. No.: 375,213

[22] Filed: Jul. 3, 1989

[51] Int. Cl.⁵ .............................................. H05K 7/02
[52] U.S. Cl. ...................................... 361/417; 29/832; 29/837; 29/840; 338/315; 361/400; 361/419; 361/420

[58] Field of Search ................. 29/832, 837, 839, 840; 338/315, 316; 361/380, 400, 405, 408, 417, 419–420, 429

[56] References Cited

U.S. PATENT DOCUMENTS 2,871,324  1/1959  Budd ................................... 361/405
4,402,037  8/1983  Iwamura et al. .................... 361/380

Primary Examiner—Gregory D. Thompson

[57] ABSTRACT

A method and article for holding and stabilizing printed circuit board components on the board during soldering or other processing.

13 Claims, 2 Drawing Sheets

HOLDER FOR PRINTED CIRCUIT BOARD COMPONENTS

BACKGROUND OF THE INVENTION AND PRIOR ART

The manufacture of printed circuit boards has become extremely competitive in the last decade particularly with the advent of IC chips which have greatly reduced both the size of the board and the number of total components that need to be mounted on any specific board.

Printed circuit boards, before the addition of any components, are manufactured with a predetermined pattern of apertures that are interconnected by "printed" conductors formed directly on the board surface. The conductors are formed by a thin metallic film on the surface of the boards formed by lamination, etching or other selective configuration process.

Because of this need to manufacture boards at the lowest possible cost while maintaining adequate quality, automated equipment has been devised for not only manufacturing the basic board but also mounting the components including IC chips, resistors, capacitors, potentiometers, and other components.

Other automated equipment, such as adjusting drivers for board mounted potentiometers is available for trimming the board circuitry after completion.

In this quest for reducing completed board cost, many of these board mounted components have been reduced in size resulting in flexible frames and thinner, more fragile, terminals so that the structural integrity of many board mounted components has been reduced. While structural integrity is not necessarily essential in many printed circuit board components because their loading is electrical as opposed to mechanical, in some cases this lack of structural integrity has created manufacturing problems.

One of these problems is holding the components against the board while its through board projecting terminals are soldered to the printed conductors. Automated holders for the more fragile components tend to misalign the components during soldering. If further automated processing is required, this misalignment causes non-alignment between such other equipment and the component.

One such further processing is the automated adjustment of trimming potentiometers, and because the fragile potentiometers are not stable they tend to bend causing the adjustment drivers to be misaligned with the potentiometer actuators.

It is a primary object of the present invention to ameliorate the problems noted above in processing fragile components on a printed circuit board.

SUMMARY OF THE PRESENT INVENTION

According to the present invention, a method and article are provided for holding and stabilizing fragile printed circuit board components on the board both during soldering and other processing such as potentiometer trimming.

The present invention is shown in relation to fragile trimming potentiometers on printed circuit boards that require stabilization both during the soldering of its terminals to one side of the board and as automated drivers engage potentiometer actuators for trimming after completion of the boards.

Toward these ends the present invention includes a one-piece plastic molded holder or stabilizer that is generally rectangular in configuration and has a plurality of enclosing chambers that fit over the components and lock them against the board in all three orthogonal directions; namely, front to back, side to side and top. This one-piece plastic molding has two spaced parallel snap-lock projections extending downwardly therefrom that fit in and lock in receiving apertures in the circuit board. These additional apertures in the circuit board add no incremental cost to the board because of the similar apertures that need to be formed in the board for receiving component terminals.

U-shaped slots formed in the front and back of the holders or stabilizers expose the component for further processing, such as potentiometer trimming and also reduce material cost of the holder itself.

While the addition of the holder to components on the boards superficially suggests an incremental cost increase, the additional cost of the holder, because of its one-piece construction and simplicity of design, is actually less than the cost of larger or beefier electrical components that do not require such support. In this regard it should be noted that certain components which have a generally planar configuration in a direction perpendicular to the board, even when constructed of heavier materials, still tend to be somewhat unstable in the weakest direction of terminal bending, and the present three orthogonal direction stabilizer completely eliminates this instability even in these heavier components.

Other objects and advantages of the present invention will appear more clearly from the following detailed description.

DETAILED DESCRIPTION OF THE PREFERRED EMBODIMENT

Figure 1:
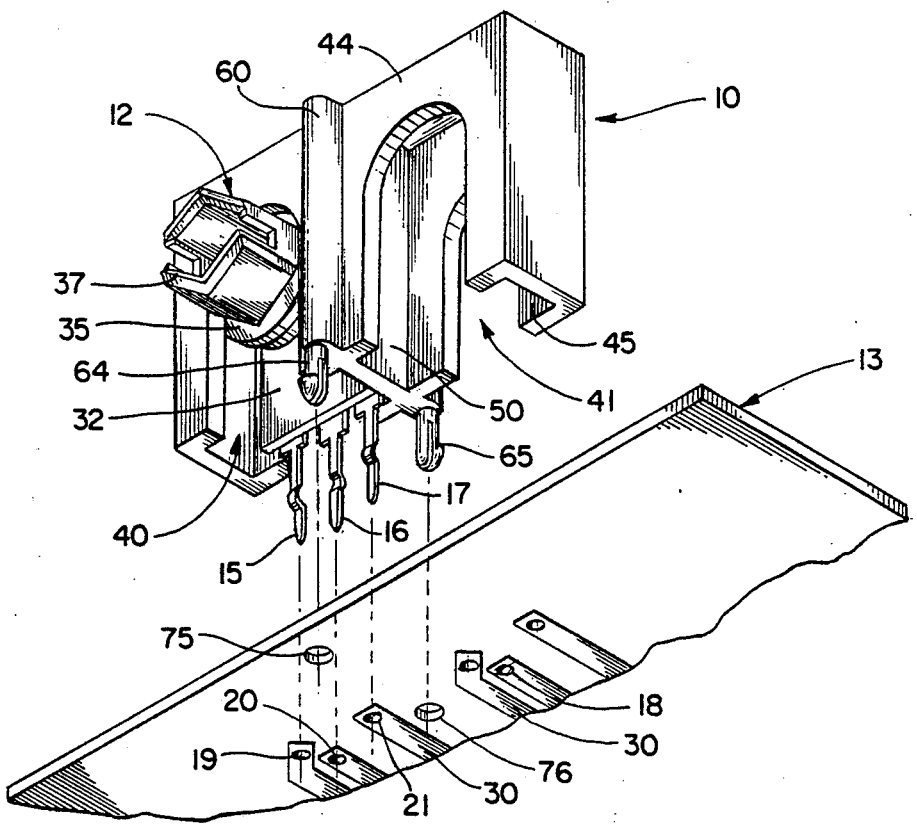
FIG. 1 is an exploded perspective of a holder and circuit board according to the present invention with one potentiometer shown carried in the holder.
Figure 2:
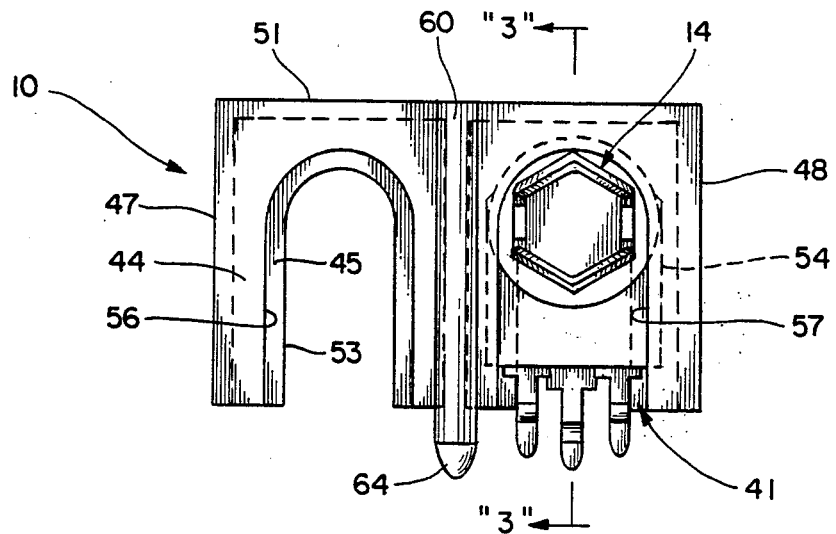
FIG. 2 is a front view of the holder illustrated in FIG. 1 with one of two potentiometers carried therein.
Figure 4:
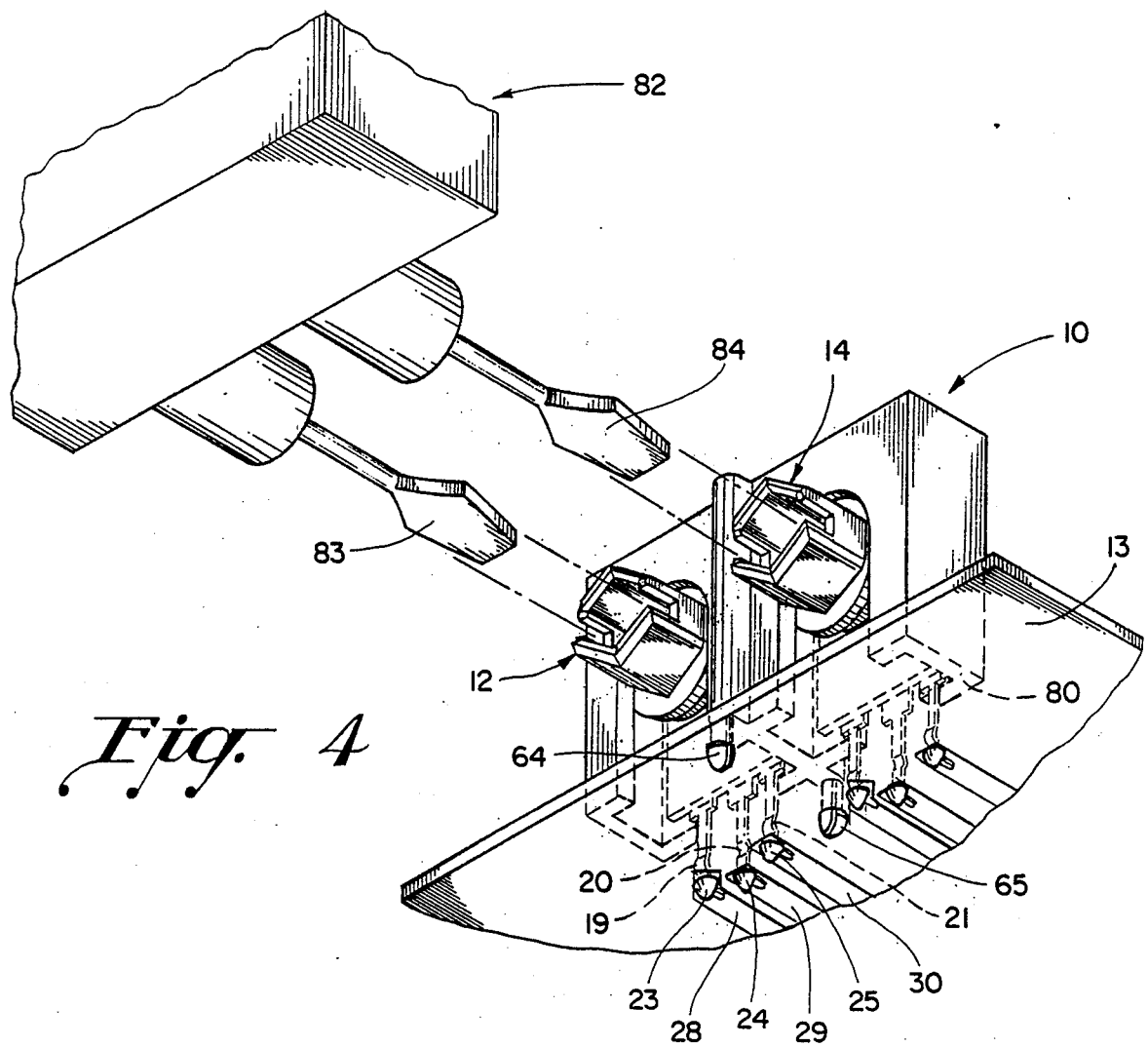
FIG. 4 is a perspective view of a fragmented circuit board with the holder and two mounted potentiometers therein with an automated driver shown approaching actuator slots in the potentiometers.

Referring to the drawings and particularly FIGS. 1 to 5, a holder or stabilizer 10 is illustrated for positioning and stabilizing potentiometers 12 and 14 against a printed circuit board 13 during soldering of component terminals 15, 16 and 17 and also stabilizing the potentiometers 12 and 14 during potentiometer trimming as seen in FIG. 4.

It should be understood that while in the embodiment shown in the drawings the holder 10 is shown particularly designed for trimming potentiometers that the holder 10 can be modified to support other components on board 13 during terminal soldering or other processing.

The printed circuit board 13 is largely conventional in construction and includes a plurality of apertures 18 for receiving the terminals of electrical components including apertures 19, 20 and 21 positioned to receive terminals 15, 16 and 17 projecting downwardly from potentiometer 12, and as seen in FIG. 4, these terminals after being positioned through the apertures are soldered at 23, 24 and 25 to conductors 28, 29 and 30 on the lower surface of board 13.

The potentiometers 12 and 14 form no part of the present invention except that they are small and somewhat fragile and include, when mounted, a vertical backboard 32 which carries a resistive element connected to terminals 15 and 16, and it has a central aperture that rotatably receives a wiper member 35 that has a conductive wiper engageable with the resistor in electrical contact with central terminal 16. This wiper is rotated to trim the potentiometer by a slotted actuator portion 37 integral with wiper member 35 to provide an extremely low cost potentiometer, although it is a readily bendable component particularly in a plane perpendicular to terminals 15, 16 and 17.

The holder or stabilizer 10 is a one-piece plastic injection molding constructed of an impact resistant plastic, which is heat resistant to withstand the heat of soldering, such as one of the polyamides with typical wall thicknesses throughout on the order of 0.040 inches with 0.031 maximum radii on all corners.

As seen clearly in the drawings, the holder 10 is generally rectangular both in plan view, cross-section and longitudinal section and has two cup-shaped cavities 40 and 41 each of which receives and holds one of the identical potentiometers 12, 14. Stabilizer 10 is defined generally by front wall 44, rear wall 45, side walls 47 and 48, partition wall 50 and top wall 51.

The rear wall 45 has a pair of identical upwardly extending inverted U-shaped cut-outs or slots 53 and 54, while front wall 44 has a pair of slightly larger and aligned inverted U-shaped slots 56 and 57 therein. Slots 53, 54, 56 and 57 permit portions of the terminals 15, 16 and 17 and the slotted actuator 37 to project from the holder 10 in an effort to make the overall holder size as small as possible consistent with its function and of course, to permit access to actuator 37.

Figure 3:
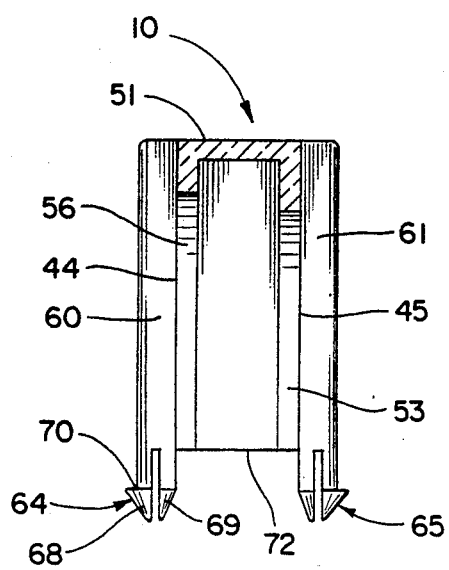
FIG. 3 is a cross-section taken generally along line 3—3 of FIG. 2.
Figure 5:
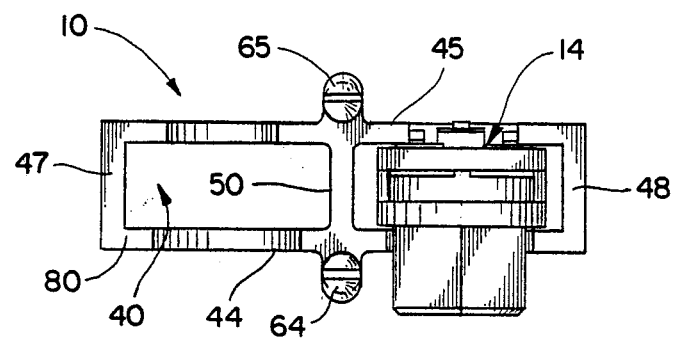
FIG. 5 is a bottom view of the holder illustrated in the other drawings with two potentiometers held therein.

Projecting from front and rear walls 44 and 45 are a pair of vertically elongated bosses 60 and 61 that provide support for integral depending snap-locking connectors 64 and 65. Each of the connectors 64 and 65 is identical except oppositely facing as seen in FIG. 3, and each includes a pair of downwardly extended flexible fingers 68 and 69 both having a semi-spheroidal configuration for guidance with enlarged headed finger 68 having a barbed flange 70 spaced from wall bottom line 72 (see FIG. 3) a distance slightly greater than the thickness of the circuit board 13 so that as the holder 10 is attached to the board by inserting connectors 64 and 65 through apertures 75 and 76 (see FIG. 1) the fingers 68 and 69 are squeezed together somewhat because together they have a larger diameter than apertures 75, 76, and after passing through the board sufficiently, the finger 68 snaps outwardly with flange 70 engaging the lower surface of the board to semi-permanently lock the connectors and the holder 10 to the circuit board.

The holder 10 can be attached to board 13 either after the potentiometers 12 and 14 are loosely dropped onto the board, or alternatively, the potentiometers can be inserted initially into the holder cavities 40 and 41 and then the entire assembly connected to the board by snap-lock connectors 64 and 65.

The top wall 51 of the holder 10 prevents movement of the potentiometer upwardly or away from the board, side walls 47, 48 and central partition wall 50 prevent or limit side to side movement of the potentiometers and front wall 44 and rear wall 45 respectively engage the potentiometer wiper member 35 and board 32 back wall to limit forward and back movement of the potentiometers.

An important aspect of the present invention is that the substantial spacing between front wall 44 and rear wall 45 and the spacing between side walls 47 and 48 define a rather large rectangular lower surface 80 (see FIGS. 4 and 5) in intimate engagement with the top of the circuit board 13 that prevents tilting of the holder either forward to back or side to side.

The holder 10, after installation over the potentiometers 12 and 14, aligns the potentiometers during initial soldering as indicated at points 23, 24 and 25 in FIG. 4, and also during the subsequent potentiometer trimming by an automated driver 82 having a pair of separately servo-controlled blades 83 and 84 thereon that trim potentiometers 12 and 14 to the desired value for final calibration of the circuitry associated with circuit board 13.

What is claimed is:

1. A component holder maintaining in position a component assembly independent of and separable from the holder and having terminals extending through apertures in a printed circuit board having conductors on one side surface thereof to which the terminals are soldered, comprising: a frame positionable over the component assembly having a downwardly opening recess constructed to slidably receive the independent component assembly without holding the component assembly together, said frame having a snap lock connector for quickly attaching it in at least one aperture in the circuit board, said frame and connector being constructed to hold the independent component assembly downwardly directly against the surface of the circuit board as the terminals are being soldered to the conductors.

2. A component holder maintaining in position a component assembly as defined in claim 1, wherein the frame is constructed to limit movement of the component assembly in three orthogonal directions to permit automated processing equipment to be aligned with the component assembly.

3. A component holder maintaining in position a component assembly as defined in claim 2, wherein the component assembly is a potentiometer having a wiper actuator engageable with automated equipment as it is being held by the frame.

4. A component holder maintaining in position a component assembly as defined in claim 1, wherein the frame is a one-piece plastic molding of generally cup-shaped design so the cup shape is inverted over the component assembly, said connector including an additional snap lock connector, said snap lock connectors being integral barbed connectors projecting downwardly from the frame.

5. A component holder maintaining in position a component assembly as defined in claim 4, wherein the frame has a plurality of cup-shaped recesses therein each adapted to receive and hold a separate component assembly.

6. A component holder maintaining in position a component assembly as defined in claim 4, wherein the frame has a generally rectangular base engageable with the circuit board that with the connectors limits movement of the component assembly in three orthogonal directions.

7. A component holder maintaining in position a component assembly independent and separate from the holder and having terminals extending through apertures in a printed circuit board having conductors on one side surface thereof to which the terminals are soldered, comprising: a one-piece plastic molded frame having a generally inverted cup-shaped configuration defining a recess the interior of which corresponds to the shape of the component assembly whereby the component assembly is engaged at least loosely in five directions, namely front to back, side to side and top, said frame recess having a downwardly opening recess constructed to slidably receive the independent component assembly without holding the component assembly together, said one-piece plastic frame having a generally rectangular base engageable with the circuit board to limit its tilting, and at least one integral snap lock connector formed on the one-piece plastic molded frame for quick engagement in an aperture in the circuit board with the component assembly encapsulated in the frame, so that the component assembly is supported on the board for further processing.

8. A holder maintaining in position component assemblies independent of and separable from the holder and having terminals extending through apertures in a printed circuit board having conductors on one side surface thereof to which the terminals are soldered, comprising: a one-piece plastic molded frame having two generally inverted cup-shaped openings therein the interior of which correspond to the shape of two component assemblies whereby the component assemblies are engaged at least loosely in five directions, namely front to back, side to side and top, said frame openings being downwardly opening constructed to slidably receive the independent assemblies without holding the component assemblies together, said one-piece plastic molded frame having a generally rectangular base engageable with the circuit board to limit its tilting, and at least one integral snap lock connector formed on the one-piece plastic molded frame for quick engagement in an aperture in the circuit board with the assemblies encapsulated in the frame, so that the component assemblies are supported on the board for further processing, said frame being a generally rectangular member, said rectangular member having a forward wall with a vertical slot therein exposing the component assemblies for further processing in the manufacture of the printed circuit board.

9. A holder maintaining in position two independent potentiometers with a projecting wiper actuator having terminals extending through apertures in a printed circuit board having conductors on one side thereof to which the terminals are soldered, comprising: a one-piece plastic molded frame having two generally inverted cup-shaped openings therein the interior of which correspond to the shape of two independent potentiometers whereby the potentiometers are engaged at least loosely in five directions, namely front to back, side to side and top, said frame openings being downwardly opening and constructed to slidably receive the independent potentiometers without holding the potentiometers together, said one-piece plastic molded frame having a generally rectangular base engageable with the circuit board to limit its tilting, and at least one integral snap lock connector formed on the one-piece plastic molded frame for quick engagement in an aperture in the circuit board with the potentiometers encapsulated in the frame, so that the potentiometers with wiper actuators are supported on the board for further processing, said frame being a generally rectangular member, said rectangular member having a forward wall with a vertical slot therein exposing the actuators for further processing.

10. A method for holding an independent electrical component assembly on a printed circuit board during manufacture, including the steps of: forming a circuit board with a plurality of component receiving assembly apertures therein and a holder receiving aperture therein with conductors extending away from the component assembly receiving apertures, forming a independent component assembly with terminals complete by itself, forming a holder positionable over the independent component assembly having a downwardly opening recess adapted to slidably receive the independent component assembly without holding the component assembly together, forming a snap lock connector on the holder, sliding the component assembly into the holder downwardly opening recess, inserting the terminals in the component assembly receiving apertures in the board, inserting the holder snap lock connector into the holder receiving aperture, and soldering the component assembly to certain conductors.

11. A method as defined in claim 10, wherein the component assembly is a potentiometer having a wiper actuator thereon, including the step of rotating the wiper actuator after the soldering step to adjust the potentiometer while it is securely aligned by the holder.

12. A method as defined in claim 10, including the step of forming the holder by injection molding a one-piece frame having a rectangular configuration with a rectangular base engageable with the board, including forming the frame with two rectangular cup-shaped receiving openings therein adapted to receive two component assemblies.

13. A method as defined in claim 12, further including the step of forming two rather than one snap lock connectors on the frame with the frame that lock in holder receiving apertures in the board.

* * * * *